(12) United States Patent
Munshi et al.

(10) Patent No.: US 12,527,134 B2
(45) Date of Patent: Jan. 13, 2026

(54) SEMICONDUCTOR DEVICES WITH STRUCTURES FOR EMITTING OR DETECTING LIGHT

(71) Applicant: CRAYONANO AS, Trondheim (NO)

(72) Inventors: Mazid Munshi, Trondheim (NO); Helge Weman, Trondheim (NO); Bjørn-Ove Fimland, Trondheim (NO)

(73) Assignee: SQUIDLED SAS, Paris (FR)

( * ) Notice: Subject to any disclaimer, the term of this patent is extended or adjusted under 35 U.S.C. 154(b) by 762 days.

(21) Appl. No.: 17/274,538

(22) PCT Filed: Sep. 10, 2019

(86) PCT No.: PCT/EP2019/074143
§ 371 (c)(1),
(2) Date: Mar. 9, 2021

(87) PCT Pub. No.: WO2020/053231
PCT Pub. Date: Mar. 19, 2020

(65) Prior Publication Data
US 2022/0052236 A1 Feb. 17, 2022

(30) Foreign Application Priority Data
Sep. 10, 2018 (GB) .................................. 1814693

(51) Int. Cl.
*H10H 20/854* (2025.01)
*H10F 77/124* (2025.01)
*H10F 77/40* (2025.01)
*H10F 77/70* (2025.01)
(Continued)

(52) U.S. Cl.
CPC ....... *H10H 20/854* (2025.01); *H10F 77/1246* (2025.01); *H10F 77/413* (2025.01);
(Continued)

(58) Field of Classification Search
CPC ......... H01L 33/56; H01L 33/10; H01L 33/20; H01L 33/32; H01L 31/02327;
(Continued)

(56) References Cited

U.S. PATENT DOCUMENTS

2013/0292687 A1* 11/2013 Jiang ................. H01L 31/03048
438/93
2015/0195549 A1* 7/2015 Wang .................. H04N 19/187
375/240.12

(Continued)

FOREIGN PATENT DOCUMENTS

CN 204167345 2/2015
CN 104393128 A 3/2015
(Continued)

OTHER PUBLICATIONS

International Search Report and Written Opinion in PCT/EP2019/074143. Mailed Nov. 22, 2019. 18 pages.
(Continued)

*Primary Examiner* — Timor Karimy
(74) *Attorney, Agent, or Firm* — Meunier Carlin & Curfman LLC

(57) ABSTRACT

The invention relates to a semiconductor device, e.g. for the emission or absorption of light, preferably in the deep ultraviolet (DUV) range. The device, e.g. a resonant cavity light emitting diode (RCLED) or a laser diode, is formed from: a substrate layer (302), preferably comprising a distributed Bragg reflector (DBR); a graphitic layer (304); and at least one semiconductor structure (310), preferably a wire or a pyramid, grown on the graphitic layer, with or without the use of a mask layer (306). The semiconductor structure is constructed from at least one III-V semiconductor n-type doped region (316) and a hexagonal boron-nitride (hBN) region (312), preferably being p-type doped hBN.

17 Claims, 9 Drawing Sheets

(51) Int. Cl.
*H10H 20/814* (2025.01)
*H10H 20/819* (2025.01)
*H10H 20/825* (2025.01)

(52) U.S. Cl.
CPC ......... *H10F 77/703* (2025.01); *H10H 20/814* (2025.01); *H10H 20/819* (2025.01); *H10H 20/825* (2025.01)

(58) Field of Classification Search
CPC ........ H01L 31/02363; H01L 31/03044; H10H 20/854; H10H 20/819; H10H 20/825; H10H 20/814; H10F 77/413; H10F 77/03; H10F 77/1246
See application file for complete search history.

(56) References Cited

U.S. PATENT DOCUMENTS

| | | | |
|---|---|---|---|
| 2016/0013365 A1* | 1/2016 | Chun | H10H 20/01335 438/34 |
| 2018/0204977 A1 | 7/2018 | Dheeraj et al. | |

FOREIGN PATENT DOCUMENTS

| | | |
|---|---|---|
| CN | 104538526 A | 4/2015 |
| JP | 2018-521516 A | 8/2018 |
| WO | 2013104723 | 1/2013 |
| WO | WO 2018141974 * | 2/2018 |
| WO | 2018141974 A1 | 8/2018 |

OTHER PUBLICATIONS

Kishino et al., "Improved Ti-mask selective-area growth (SAG) by rf-plasma-assisted molecular beam epitaxy demonstrating extremely uniform GaN nanocolumn arrays", Journal of Crystal Growth, vol. 311, Issue 7, 2009, pp. 2063-2068.
Laleyan et al., "AlN/h-BN Heterostructures for Mg Dopant-Free Deep Ultraviolet Photonics", Nano Letters, American Chemical Society, 2017.
Laleyan et al., Supporting Information, "AlN/h-BN Heterostructures for Mg Dopant-Free Deep Ultraviolet Photonics", Nano Letters, American Chemical Society, 2017.
Jiang H X et al. "Hexagonal boron nitrade for deep ultraviolet photonic devices", Semiconductor Science and Technology, IOP Publishing Ltd, GB, vol. 29, No. 8, 084003, Jun. 6, 2014.
Search Report in GB1814693.6. Mailed Feb. 26, 2019. 3 pages.
Notification of Reason(s) for Rejection issued on Feb. 2, 2023, in Japanese Patent Application No. 2021-513219.
Notice of Final Rejection issued on Feb. 14, 2024, in Korean Patent Application No. 2021-7010543.

* cited by examiner

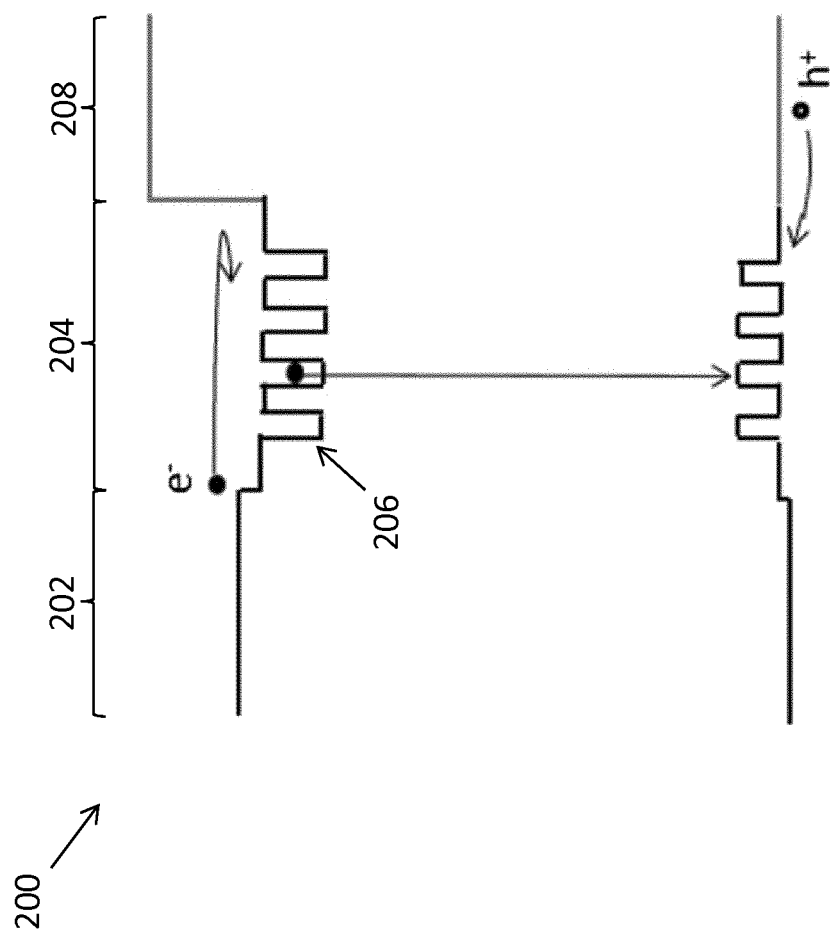

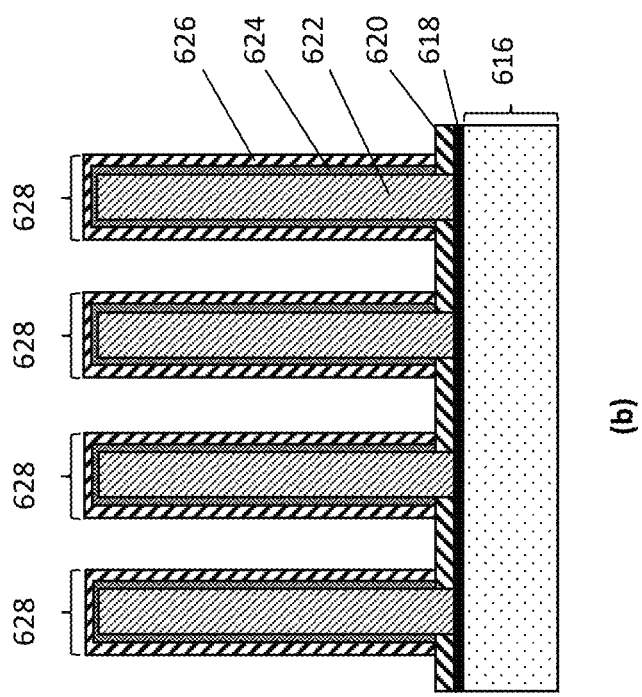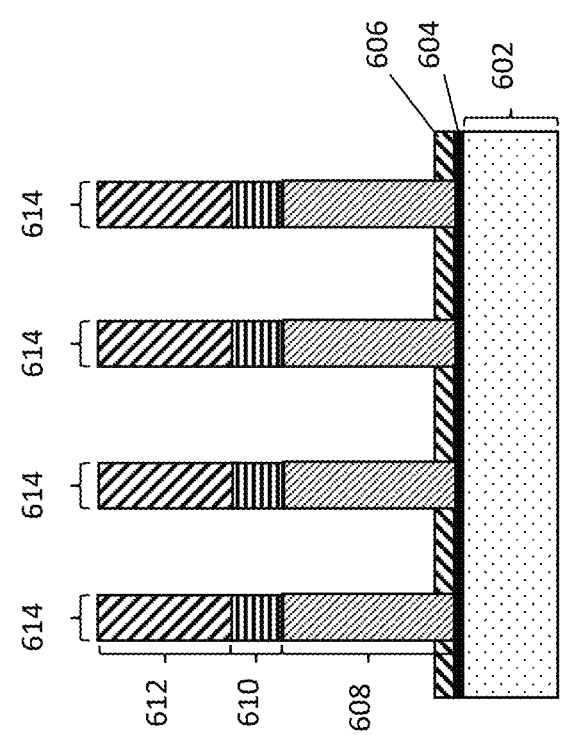
Fig. 6

SEMICONDUCTOR DEVICES WITH STRUCTURES FOR EMITTING OR DETECTING LIGHT

CROSS REFERENCE TO RELATED APPLICATIONS

This application is a United States National Phase Patent Application of International Patent Application Number PCT/EP2019/074143, filed on Sep. 10, 2019, which claims the benefit of priority to GB Application No. 1814693.6, filed Sep. 10, 2018, the contents of which are incorporated by reference herein in their entirety.

The present disclosure relates to semiconductor devices comprising semiconductor structures for emitting or detecting light, in particular nanostructures such as nanowires (NWs) and nanopyramids (NPs). In particular, it relates to semiconductor devices comprising III-V semiconductor structures, comprising hexagonal boron nitride (hBN) layers, that are grown on graphitic layers.

Semiconductor devices have been used in a variety of applications over the years. For example, light emitting semiconductor devices, such as light emitting diodes (LEDs) and semiconductor lasers, have been used to generate light for lighting applications and telecommunications. Semiconductor devices have also been used as detectors of light, for various applications such as imaging technologies, and optoisolators. Semiconductor diodes have also been used in electronic applications to, for example, control the direction of current flow. Some semiconductor devices have a junction formed by a p-type doped region and an n-type doped region (e.g. a so-called p-n junction). Efficient operation of such devices (e.g. to generate light or to provide a current flow direction with low resistance) is provided by controlling the flow of current across the junction. For example, ideally in light emitting devices, the electron flow should be controlled so that electrons in the conduction band of the n-type region do not leak into the conduction band of the p-type region.

Light emitters such as LEDs and lasers, or detectors such as photodiodes, operating in the deep ultraviolet (DUV) range are of interest for applications such as sterilisation, spectral analysis, and photocatalysis. Current semiconductor LED and laser emitters tend to use group III-V semiconductor materials such as AlGaN (or other group III-nitride materials) to generate DUV light in the 200-300 nm wavelength range. For example, a typical DUV LED/laser comprises one or more AlGaN quantum wells (QW) arranged between a p-type doped AlGaN region and an n-type doped AlGaN region. The QWs may form part of the device's intrinsic region for the generation of light (e.g. a light generating region or so-called active region). Light is generated by applying a forward bias across the p-n junction (formed by the p-type region and the n-type region) so as to inject electrons and holes into the QWs from the n-type region and p-type region, respectively. Electrons and holes within the QWs ideally recombine to generate light. In general, it is not preferable for electron and hole carriers to recombine non-radiatively in light emitters as this does not provide light.

To prevent electrons from leaking into the p-type region, and thereby not recombining radiatively in the QWs to generate light, nitride based emitters may incorporate an electron blocking layer (EBL) in the p-type region. The EBL forms a potential barrier in the conduction band of the p-type region. This barrier serves to inhibit electrons from the n-type region, and/or from the QWs, travelling through the p-type region. Typically, suitable types of EBLs include AlN or AlGaN.

In general, the morphology of most semiconductor devices (e.g. LED, lasers, photodetectors, and rectifying diodes) is defined by top-down etching (or other top-down processes such as lift-off) of a pre-grown layer structure. As an example, a conventional DUV AlGaN-based LED/laser emitter may be formed by etching a pre-grown layer structure e.g. a layer structure comprising: one or more AlGaN quantum wells (QW) arranged between a p-type doped AlGaN region and an n-type doped AlGaN region. This top-down processing defines the structure of the device—e.g. it may define a ridge shaped LED/rectifying diode structure or a vertical cavity shaped laser structure. The layers of the pre-grown structure are usually grown using a thin-film growth technique on a suitable substrate (e.g. sapphire). In general, the growth of each thin-film layer forms a continuous layer that grows to cover the entire surface of the underlying material (e.g. a thin-film layer of AlGaN grown on a sapphire substrate forms a continuous layer that covers the top surface of the sapphire). Devices that have their morphology defined via top-down processing of a pre-grown thin film layer structure may be referred to in the art as thin-film devices.

Semiconductor devices such as the ones discussed above (operating in the DUV spectrum) also experience issues of light extraction. For example, a traditional substrate material such as sapphire has a transmittance of up to around 85% from 200-300 nm. Furthermore, a typical top contact is made from metal, which has a rather low transmittance at the relevant wavelengths.

Using AlN or AlGaN EBLs for thin-film AlGaN devices (e.g. AlGaN LEDs/lasers) may provide an EBL layer with few defects. However, such devices may still suffer from a low external quantum efficiency (EQE) characteristic. One of the main reasons for this is that the AlN EBL forms a potential barrier in the valence band of the p-type region. A barrier such as the AlN EBL increases the forward bias resistance of the device and thereby reduces the carrier injection efficiency (CIE) of the device.

A further issue with such devices is that the p-type doped AlGaN region has a low doping efficiency. The low doping efficiency limits the hole carrier concentration, resulting in a high resistivity/low conductivity of the region. This results in a low hole injection efficiency. Another issue is that, in order to provide a good ohmic contact, such devices may have a thin-p-type GaN layer between the p-type AlGaN and metal p-electrode. This is problematic because the p-type GaN layer absorbs DUV light and thereby reduces the light extraction efficiency (LEE).

The present invention aims to address at least some of the above issues.

From a first aspect, the invention provides a semiconductor device comprising:
a substrate layer,
a graphitic layer,
at least one semiconductor structure grown on the graphitic layer, the structure comprising at least:
a III-V semiconductor n-type doped region,
a hexagonal Boron-Nitride (hBN) region.

Thus a semiconductor device is provided e.g. for emitting/absorbing light. The use of hBN in the structure provides multiple benefits. Firstly, the hBN region may act as the p-type region of the semiconductor structure, injecting holes for radiative recombination in a light generating region. This replaces the standard p-type doped AlGaN region of known devices. hBN is advantageous in this respect, as it exhibits a naturally high intrinsic carrier concentration. Furthermore, the valence energy band is closely matched to the valence energy level of e.g. AlGaN devices, making hole injection into AlGaN layers more efficient. These advantages result in a higher carrier injection efficiency in the valence band of the semiconductor structure, increasing the overall EQE of the device.

In some embodiments, alternatively or in addition, the graphitic layer is disposed on the substrate layer. This allows for the graphitic layer to be transferred or grown directly onto the substrate layer, removing the necessity of other, complicated processing steps involving other layers. The substrate layer may be a sapphire substrate, a GaAs substrate, a GaN substrate, an AlN substrate, a Si substrate, a SiC substrate, a glass substrate, a metallic substrate (e.g. Mo, W, Ti, Ta, Hf foils), or a fused silica substrate. Other substrate materials are also envisaged. The substrate layer may be combined with the graphitic layer—e.g. a sapphire substrate, a fused silica, or a quartz substrate with a graphene layer deposited on its epitaxial face (the face of the substrate upon which the semiconductor structure(s) is/are grown).

The skilled person will appreciate that the choice of substrate layer and its thickness may vary, for example, depending on the wavelength of light to be emitted/absorbed by the device and the function of the spacer layer. Some layers may be transparent to one wavelength of light but not others. For example, GaAs is transparent to IR laser light.

In some embodiments, alternatively or in addition, the substrate layer comprises a Distributed Bragg Reflector (DBR). A DBR is a periodic structure formed from alternating dielectric or semiconductive layers that can be used to achieve nearly total reflection within a range of frequencies. This range of frequencies may include the emission/absorption spectrum of the semiconductor structure. A DBR is a structure formed from multiple layers of alternating materials with varying refractive index, or by periodic variation of some characteristic (such as height) of a dielectric waveguide, resulting in periodic variation in the effective refractive index in the guide. DBRs of this disclosure can be dielectric or semiconductive. The DBR may be in electrical contact with the graphitic layer or be separated therefrom by a transparent spacer layer. The term transparent is used to mean transparent with respect to the light emitted/absorbed by the device. The DBR may be optically coupled to the n-type region or the hBN region of the semiconductor structure, so as to reflect light emanating from the n-type region or the hBN region back into said region, and towards the centre of the structure. The light may be reflected along the major axis of the structure—e.g. along the axial axis of a nanowire.

In some embodiments, alternatively or in addition, the hBN region is p-type doped. This advantageously provides more hole carriers for injection towards the active and the n-type region(s). For example, p-type doping the hBN region enables more carriers to be driven into an intrinsic region (which may form a light generating region) arranged between the n-type and p-type doped regions. The additional carriers also reduce the resistivity (or rather increase the conductivity) of the hBN region to provide a lower resistance device. In this way, doping the hBN with p-type dopants reduces the drive voltage for a given forward current across the p-n region. Furthermore, the hBN region can be easily doped to a high concentration, without degrading performance. Combined with the high intrinsic carrier concentration of hBN, this ease of doping provides the material with an extremely high carrier concentration. As explained above, this increases the carrier injection efficiency into the light generating region, increasing the internal quantum efficiency of the device.

In some embodiments, alternatively or in addition, the p-type doped hBN region forms a contact layer. Due to the high carrier concentration of p-type doped hBN, it is possible to use the hBN itself as a contact layer, replacing the need for an additional contact layer entirely. This is advantageous as it reduces the number of processing steps and materials involved in fabricating the device. For example, the p-type doped hBN region may form a contact layer for making ohmic contact with an (e.g. metal) electrode, e.g. instead of a typical p-GaN contact layer in LEDs. Furthermore, other disadvantages of using an additional contact layer, such as absorption, are avoided by using the hBN region as the contact layer. As hBN is substantially transparent to DUV wavelengths, emitted/absorbed light can be guided through the hBN region, for increased light extraction efficiency (LEE), or for increased absorbance. The use of the hBN region as a top contact layer also replaces the need for a highly doped region, e.g. AlGaN for connection with a top metal contact. hBN provides improved conduction characteristics compared to these alternatives, increasing the EQE of the semiconductor device. Furthermore, UV light will be absorbed a lot by traditional Indium Tin Oxide (ITO) contacts, which dramatically reduces the laser performance by reducing the LEE.

In some embodiments, alternatively or in addition, the hBN region comprises a plurality of hBN layers, at least one of which is undoped, and at least one of which is p-type doped. By separating the hBN region into undoped and doped layers, it is possible to optimize the interfaces between these layers and their adjacent regions. For example, an undoped hBN region may exhibit improved interface characteristics with a light generating region, such as carrier injection efficiency, and therefore may be positioned adjacent the light generating region. At the same time, a doped hBN region may exhibit improved interface characteristics with a top contact layer, and therefore may be positioned adjacent to a top contact layer.

In some embodiments, alternatively or in addition, the undoped hBN layer forms an interface with the n-type doped III-V semiconductor region. This interface enables increased carrier injection from the valence band of the hBN region into the valence band of the n-type doped III-V semiconductor region, due to the closely matched valence band energies, reducing the resistance between these layers, and thus increasing the EQE of the device. The hBN layer also forms a potential barrier in the conduction band of the device, increasing carrier confinement in the n-type doped III-V semiconductor region.

In some embodiments, alternatively or in addition, the III-V semiconductor n-type doped region is grown on the graphitic layer, and the hBN region is deposited on the n-type doped region. This defines the morphology of the device. By growing the n-type doped region on the graphitic layer, and later depositing the hBN region on the n-type doped region, a defined process flow can be followed, enabling streamlined production of the devices. This can both increase manufacturing speed and reduce manufacturing cost.

In at least some embodiments, the at least one semiconductor structure may be a microstructure. In one or more preferred embodiments, however, the at least one semiconductor structure is a nanostructure, for example a nanowire or a nanopyramid. The term nanostructure as used herein to describe a solid structure of nanometre or micrometre dimensions.

In some embodiments, alternatively or in addition, the at least one semiconductor structure is grown bottom-up from the graphitic layer, for example by any suitable bottom-up epitaxial growth mode. Bottom-up growth enables the micro/nanostructures to be grown to form free-standing micro/nanostructures (e.g. nanowires). Bottom-up growth also enables positioned growth of the micro/nanostructures. This may be achieved, for example, through molecular beam epitaxy (MBE), or by metal organic chemical vapor deposition (MOCVD). Thus, those skilled in the art will appreciate that bottom-up growth may grow one or more micro/nanostructures on certain portions/regions of the graphitic layer. The certain positions/regions may be randomly selected. Alternatively, the certain positions/regions may be pre-selected (e.g. by growing the micro/nanostructure(s) through the holes of a hole-patterned mask on a substrate).

Further, it will be seen that bottom-up growth directly defines the shape of the micro/nanostructure (e.g. the elongated shape of a nanowire or the faceted shape of a nanopyramid). In this way, top-down processing (e.g, etching) is not required after growth of a device's III-V semiconductor n-type doped region and hBN region, for defining a micro/nanostructure in the grown layers. However, it will be appreciated that after bottom-up growth has been used to define a micro/nanostructure, subsequent top-down processing may be used to, for example, further shape the micro/nanostructure, fill the space between micro/nanostructures, and/or define contact electrodes.

It has been found that micro/nanostructures grown bottom-up (e.g. using a suitable growth mode) can accommodate much more lattice mismatch than thin films, for example. This is advantageous because it leads to fewer defects in the hBN region. As a result, for example, bottom-up grown micro/nanostructures with higher quality hBN regions can be used to provide more efficient devices such as lasers, LEDs, and photodetectors. In light emitting/detecting applications, such improvements have been found to provide devices with higher EQEs, IQEs, CIEs, and/or LEEs. In electronic applications, such improvements have been found to provide devices (e.g. rectifying diodes) with higher CIEs.

This technique also allows the device to make use of the graphitic layer's specific benefits. For example, the graphitic layer is substantially transparent (i.e. has a high transmittance) to DUV light, and thus emitted/absorbed light can be guided out from the micro/nanostructure through the graphitic layer/in from the graphitic layer to the micro/nanostructure. Furthermore, the graphitic layer may be used as, for example, a bottom electrode for the micro/nanostructure, providing the required current to initiate light generation. The graphitic layer may be transferred graphene or graphene glass, but could also be a different type of graphitic substance like epitaxial graphene.

In some embodiments, alternatively or in addition, the structure further comprises an intrinsic III-V semiconductor region between the n-type doped region and the hBN region. This intrinsic region may act as a light generating region or active region. The intrinsic region may exhibit increased light generation in comparison to the n-type doped region or the hBN region, due to enhancement of the above mentioned benefits (e.g. increased CIE, improved band energy matching, increased carrier confinement etc.).

In some embodiments, alternatively or in addition, the structure further comprises a p-type doped III-V semiconductor region. This region may be arranged between the hBN region and the intrinsic/n-type doped region of previous embodiments, in order to provide carrier injection to the intrinsic region/n-type region of the device. The inclusion of this p-type doped III-V semiconductor region may also provide enhancement of the above mentioned benefits.

In some embodiments, alternatively or in addition, the III-V semiconductor n-type doped region is positioned closer to the graphitic layer than the hBN region is positioned to the graphitic layer. In some embodiments, the n-type doped region comprises electrons, the p-type doped region comprises holes, and the structure further comprises an intrinsic III-V semiconductor region arranged to receive electrons from the n-type doped region and holes from the p-type doped region so that the received electrons and holes undergo recombination to emit light. Thus, light emitting devices may be formed.

In some embodiments, the n-type doped region comprises electrons, the p-type doped region comprises holes, and the structure further comprises an intrinsic III-V semiconductor region arranged to generate electron-hole pairs upon absorbing a photon. Thus, photo-detecting devices may be formed.

In at least some of those embodiments where the structure comprises an intrinsic region, the intrinsic region comprises at least one heterostructure. The use of heterostructures in the intrinsic region allows for increased light generation/detection.

In some embodiments, the heterostructure is a quantum heterostructure. In some embodiments, the quantum heterostructure is a quantum well, a quantum dot, or a superlattice. A superlattice may comprise multiple quantum well/dot layers. In some embodiments, alternatively or in addition, the heterostructure is an AlGaN or Al(In)GaN heterostructure or comprises GaN, AlN, AlGaN or Al(In)GaN.

In some embodiments, alternatively or in addition, the hBN region acts as an electron blocking layer (EBL). By providing a high energy level compared to the n-type doped region in the conduction band, the hBN region traps carriers in the conduction band of the adjacent layer. This potential barrier inhibits and/or blocks electrons in the n-type region from flowing across to the hBN (p-type) region. For example, in a device comprising an n-AlGaN region, the hBN region has a large conduction band offset compared to the n-AlGaN region. Thus, the hBN region, acting as an EBL, efficiently blocks the electrons from leaking from the n-AlGaN region across the hBN region. Also, in examples where the device comprises an intrinsic region (preferably for the generation/detection of light), the hBN EBL is arranged to inhibit and/or block electrons in the intrinsic region from flowing across the hBN (p-type) region. In these ways, electron leakage in the region adjacent the hBN region is reduced. In the prior art, an EBL e.g. AlN, would typically have a lower valence band energy than the adjacent layer. This means that there is a potential barrier for carriers, increasing the resistance of the interface, and further reducing the carrier injection efficiency of the device.

In some embodiments, alternatively or in addition, the hBN region acts as an encapsulating or passivation layer. The hBN region may therefore protect the nanostructure from external damage/influence, in particular, it may passivate the surface states which act as non-radiative recombination centres. In devices comprising a filler material around the nanostructure(s), this hBN encapsulation/passivation layer may prevent any current leakage from the micro/nanostructure into the filler material.

In some embodiments, alternatively or in addition, the III-V semiconductor is a group III-nitride semiconductor.

In some embodiments, alternatively or in addition, the structure comprises an n-type doped AlGaN or Al(In)GaN region, a p-type doped AlGaN or Al(In)GaN region, and an AlGaN or Al(In)GaN intrinsic region.

In some embodiments, alternatively or in addition, the at least one semiconductor structure is a nanostructure, for example a nanowire or a nanopyramid. In at least some of those embodiments where the structure is a nanostructure, the nanostructure comprises an axial heterostructure and/or a radial heterostructure. A radial nanostructure is also known as a core-shell nanostructure.

In an axial nanostructure, a first region may be grown to have a planar top or inclined top surface for the growth of subsequent layers of the nanostructure. Accordingly, it will be understood that the top surface may face away from the epitaxial face of the substrate. In some embodiments, a doped region of opposite doping type may be grown directly on the top surface of the axial nanostructure—e.g. a p-type doped region may be grown on a top surface of an n-type doped region. In other embodiments, an intrinsic region may be grown directly on a top surface of the first region of an axial nanostructure. In the latter case, a doped region of opposite doping type to the first region may be grown directly on top of the intrinsic region.

In a radial or core-shell nanostructure, the first region may be referred to as a core region. Layers of a core-shell nanostructure grown on an inclined outer surface of the first region may form part of the so-called shell region.

Preferably, a first region (e.g. an n-type doped region or a p-type doped region) of a core-shell nanostructure may be grown to have at least one inclined outer surface relative to the epitaxial face of the substrate for the growth of subsequent layers of the nanostructure. The inclined outer surface may face away from the epitaxial face of the substrate. The inclined outer surface may define an acute angle of between 0 and 90 degrees relative to the epitaxial face of the substrate. In some embodiments, a doped region of opposite doping type may be grown directly on the inclined outer surface of the core-shell nanostructure (e.g. a p-type doped region may be grown on an inclined outer surface of a first n-type doped region). In other embodiments, an intrinsic region may be grown directly on an inclined outer surface of the first region of a core-shell nanostructure. In the latter case, a doped region of opposite doping type to the first region may be grown directly on top of the intrinsic region.

The inclined outer surface(s) of a core-shell nanostructure may define a sidewall, or a set of sidewalls, of the nanostructure (e.g. nanowire or nanopyramid). The sidewall(s) preferably protrude from the substrate and extend from a base of the nanostructure. The base of the nanostructure preferably faces the substrate and may be in parallel with the epitaxial face of the substrate. Ideally, the base of the nanostructure is in direct contact with epitaxial face of the substrate.

In some embodiments, alternatively or in addition, the nanostructure is grown through the holes of a hole-patterned mask on the graphitic layer. As explained above, this allows for predetermined positioned growth of the nanostructures.

In some embodiments, the device is a resonant cavity light-emitting diode (RCLED).

In some embodiments, alternatively or in addition, the device further comprises a metal layer on a surface of the at least one semiconductor structure. In some embodiments, the metal layer acts as a top contact layer. This allows for the device to be provided with an external voltage for forward/reverse biasing the nanostructure(s). In some embodiments, alternatively or in addition, the metal layer acts as a mirror. In this way, the metal layer can reflect light that has been emitted/absorbed by the nanostructure, in order to guide the light back into the nanostructure for further emission/absorption.

BRIEF DESCRIPTION OF DRAWINGS

Certain preferred embodiments of the invention will now be described, by way of example only, with reference to the accompanying drawings, in which:

FIG. 2 illustrates the band structure of a semiconductor structure having a p-type doped hBN region in accordance with an embodiment of the present invention;

FIG. 6a illustrates the structure of an axial NW in accordance with an embodiment of the present invention;

FIG. 6b illustrates the structure of a core-shell NW in accordance with an embodiment of the present invention.

DEFINITIONS

Figure 1:
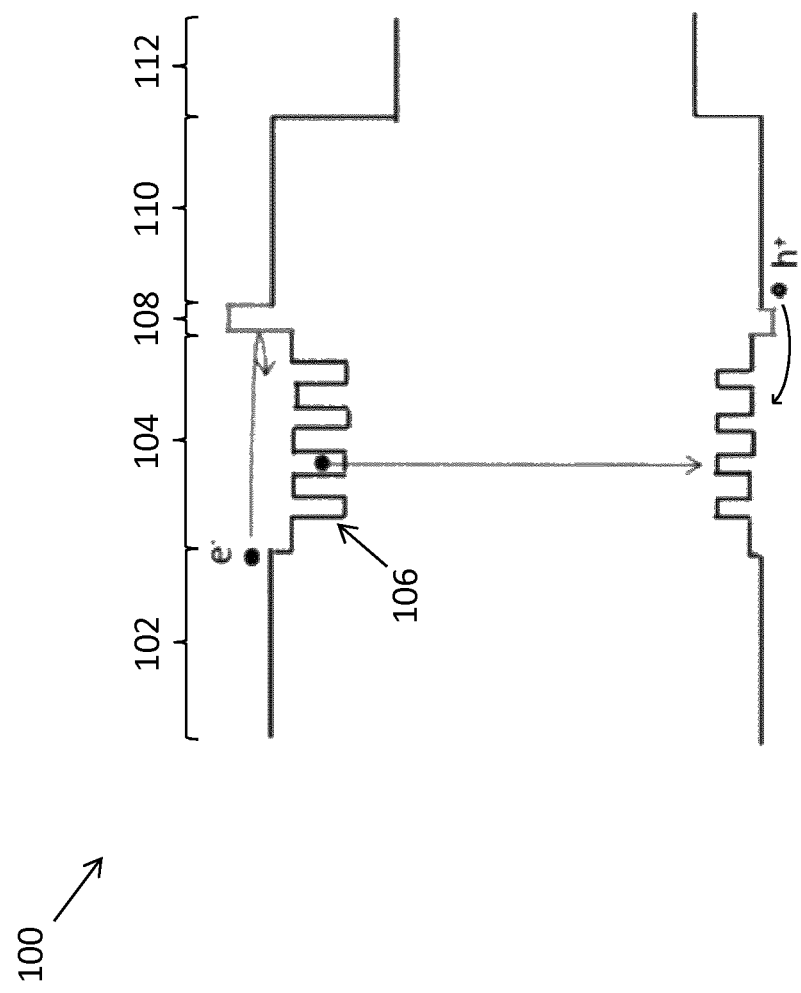
FIG. 1 illustrates the band structure of a known AlGaN-based thin-film device having an AlN electron blocking layer.

The term microstructure means any structure having at least one micrometre dimension, usually as its smallest dimension. The term nanostructure means any structure having at least one nanometre dimension, usually as its smallest dimension.

The term microwire (MW) is used herein to describe a solid, wire-like structure of micrometre dimensions. Thus it will be appreciated that MWs are elongate microstructures. MWs preferably have an even diameter throughout the majority of the MW, e.g. 75% of its length. The term MW is intended to cover the use of microrods, micropillars, microcolumns or microwhiskers some of which may have tapered or inversely tapered end structures. The MWs have micrometre dimensions in their width or diameter and their length typically in the range of a 1 µm to 100 µm. Ideally the MW diameter is between 1 µm and 50 µm. Ideally, the diameter at the base of the MW and at the top of the MW should remain about the same (e.g. within 20% of each other).

The term micropyramid (MP) is used herein to describe a solid, pyramid-like structure of micrometre dimensions in the range of 1 µm to a few hundred µm. For example, the base width of a MP may be from around 1 µm to 20 µm, with a height of around 1 µm to 20 µm. MPs have a base and three or more (preferably six) sidewalls angularly offset from the base. These inclined sidewalls typically make an angle of 25-62° or more with the base. Preferably, the sidewalls converge together and they may converge to define an apex, however it is possible that they may also have a small flat top surface. The base of the MP is preferably coplanar with the epitaxial face of the substrate.

The term nanowire (NW) is used herein to describe a solid, wire-like structure of nanometre dimensions. Thus it will be appreciated that NWs are elongate nanostructures. NWs preferably have an even diameter throughout the majority of the NW, e.g. 75% of its length. The term NW is intended to cover the use of nanorods, nanopillars, nanocolumns or nanowhiskers some of which may have tapered end structures. The NWs can be said to be in essentially in one-dimensional form with nanometre dimensions in their width or diameter and their length typically in the range of a few 100 nm to a few µm (e.g. 8 µm). Ideally the NW diameter is between 50 and 500 nm. It will be appreciated that there is normally a specific diameter in order for the NW to confine a certain optical mode(s) and act as a waveguide. The specific diameter depends on the effective refractive index of the NW and the emission wavelength. Ideally, the diameter at the base of the NW and at the top of the NW should remain about the same (e.g. within 20% of each other).

The term nanopyramid (NP) is used herein to describe a solid, pyramid-like structure of nanometre dimensions in the range of a few 100 nm to a few µm. For example, the base width of a NP may be from around 200 nm to 10 µm, with a height of around 200 nm to 10 µm. NPs have a base and three or more (preferably six) sidewalls angularly offset from the base. These inclined sidewalls typically make an angle of 25-62° or more with the base. Preferably, the sidewalls converge together and they may converge to define an apex, however it is possible that they may also have a small flat top surface. The base of the NP is preferably coplanar with the epitaxial face of the substrate.

It will be appreciated that the substrate preferably carries a plurality of micro/nanostructures (e.g. NWs and/or NPs). This may be called an array of micro/nanostructures. In some examples, however, it is envisaged that a light emitting device such as a LED/laser device could be developed using a single micro/nanostructure.

Typically, NWs have a width of the order of hundreds of nanometres or less (e.g. 500 nm-50 nm), and an aspect ratio (length-to-width ratio) of 10 or more. However, aspect ratios of fewer than 10 are also envisaged. For example, a nanowire with a width of 200 nm and a length of 400 nm has an aspect ratio of 2. Given these typical dimensions, NWs are often considered to have a one-dimensional (1D) anisotropic geometry.

The dimensions of a NW may confine light within the NW in two lateral dimensions since the nanowire diameter is symmetric. The optical confinement occurs due to the width of the NW, and the refractive index contrast between the NW and surrounding material (e.g. air or a filler). The optical confinement enables light to be guided along the length of the NW. By modulating the material structure and/or composition within the NW, the length, and the width (e.g. diameter) of the NW, the optical modes supported inside the NW cavity may be tuned flexibly.

The present inventors appreciate that with its one dimensional (1D) anisotropic geometry, a NW structure itself may work as both (i) a Fabry-Pérot optical cavity (e.g. in which light may circulate), and (ii) a gain medium that is suitable for amplifying light and which has strong carrier and optical confinement, and an enhanced electronic density of states. With these properties, NW lasers/LEDs are expected to be more efficient in performance and much smaller in dimension than other laser/LED sources.

Epitaxial growth means herein the growth on the substrate of a micro/nanostructure that mimics the orientation of the substrate. In embodiments herein, the micro/nanostructures are grown directly using a bottom-up epitaxial growth mode. It will be appreciated that the epitaxial growth of a micro/nanostructure defines the morphology of the micro/nanostructure, although subsequent top-down processing or additional growth steps may be used to further shape the micro/nanostructure, or to define additional features of the micro/nanostructure such as a p-electrode or an n-electrode.

Epitaxially grown bottom-up micro/nanostructures may be grown from solid, gaseous or liquid precursors. Because the substrate acts as a seed crystal, the deposited micro/nanostructure can take on a lattice structure and/or orientation similar to those of the substrate. This is different from some other thin-film deposition/growth methods which deposit polycrystalline or amorphous films, even on single-crystal substrates.

The term resonant cavity or optical cavity is defined as the region where generated light may oscillate back and forth within a region of the micro/nanostructure or device. For example, an optical cavity may be formed between two DBRs or metal mirrors that are arranged on opposing sides of a device, wherein one or more micro/nanostructures of the device are arranged between the DBRs/metal mirrors. In another example, a light generating region (e.g. an intrinsic region having QWs) and surrounding cladding regions within a micro/nanostructure may define an optical cavity. In this case, light may travel back and forth between the cladding layers, and thereby through the intrinsic region in each pass. Two DBRs or metal mirrors arranged on opposing sides of the micro/nanostructure may circulate light within the micro/nanostructure.

It will also be appreciated that the micro/nanostructures described herein may be grown without a light generating region for photodetection, current rectifying applications or other electronic applications. In this case, the micro/nanostructures may not emit light.

Thus, it will be appreciated that micro/nanostructure lasers/LEDs may provide many desirable characteristics. However, to date, making such devices, in particular NW Vertical Cavity Surface Emitting Lasers (VCSELs) and NW Resonant Cavity Light Emitting Diodes (RCLEDs), remains difficult and there are several critical scientific and practical challenges still to be solved. Some of these challenges are listed below and there is a need to address these challenges, particularly to fabricate arrays of micro/nanostructures (which is desirable to induce optical coupling between neighbouring micro/nanostructures for making light emitting photonic crystal (PC) arrays):

1. Difficulty of monolithic integration. It is challenging to grow vertical III-V micro/nanostructures epitaxially on a distributed Bragg reflector (DBR) or metal mirrors. For example, GaAs-based NWs are epitaxially grown in the [111] direction, which is not compatible with two dimensional (2D) GaAs/AlAs DBRs that are grown on GaAs(100).
2. It is difficult to make an electrically pumped laser/LED since many DBR materials suitable as mirrors have low conduction or are even insulating.

By providing a means to circulate light along the length of a nanostructure (e.g. by providing a mirror at both ends of a NW/NP), the nanostructure may form a nanostructure VCSEL/RCLED. The structure of a RCLED may be the same as the VCSEL but, in operation, the RCLED is arranged to operate below lasing threshold, rather than at or above lasing threshold. Thus, it will be appreciated that the below descriptions of a NW/NP VCSEL also describe the structure of a NW/NP RCLED. It will also be appreciated that when operating below laser threshold, the NW/NP VCSEL may be considered to be a RCLED. The light output from the NW/NP RCLED will predominantly comprise spontaneous emission because it operates below laser threshold. The light output from the NW/NP VCSEL will predominantly comprise stimulated emission when operating at or above lasing threshold.

Preferably, the length of a nanostructure VCSEL, and/or a nanostructure RCLED, extends substantially vertically from the horizontal plane of the substrate on which they are respectively arranged. Thus, it will be appreciated that, in some embodiments, nanostructure VCSELs and nanostructure RCLEDs emit light in a direction that is inclined relative to the horizontal plane of the substrate, rather than emitting light in a direction that is substantially parallel with the plane of the substrate.

In use, the active region of the nanostructure is electrically pumped with a current of few tens to hundreds of $kA/cm^2$ and generates an output power in the range from few to tens of $kW/cm^2$. The current is applied through an n-electrode in electrical connection with the n-type doped region, and a p-electrode in electrical connection with the p-type region (hBN) of the nanostructure. In one embodiment, the graphitic substrate acts as one electrode through which current can be supplied to the nanostructures. The device can also be provided with an external electrode as required.

A benefit of having a plurality of nanostructures is that each nanostructure provides an individual source of electron-hole recombination processes e.g. for generating light. Further, a benefit of arranging the nanostructures in an array is that the array may form a photonic crystal (PC). Positioned bottom-up growth of the nanostructures allows direct and efficient tuning of the array parameters (e.g. pitch). For example, in light emitting applications, this may affect the directionality/angular distribution of the emitted light. For light absorbing applications, this may enhance the absorption characteristics of the nanostructures.

Graphitic Layer

As described, in some embodiments the graphitic layer is graphene. The term graphene refers to a planar sheet of $sp^2$ carbon atoms that are densely packed in a honeycomb (hexagonal) crystal lattice. The graphitic layer should preferably be no more than 20 nm in thickness. Ideally, it should contain no more than 10 layers of graphene or its derivatives, preferably no more than 5 layers (which is called as a few-layered graphene). Especially preferably, it is a one-atom-thick planar sheet of graphene. The area of the graphitic layer in general is not limited. This might be as much as 0.5 $mm^2$ or more, e.g. up to 5 $mm^2$ or more such as up to 10 $cm^2$. The area of the graphitic layer is thus only limited by practicalities.

The crystalline or "flake" form of graphite consists of many graphene sheets stacked together (i.e. more than 10 sheets). By graphitic layer therefore, is meant one formed from one or a plurality of graphene sheets. Alternatively, the graphitic substrate could be grown on a Ni film or Cu foil by using a chemical vapour deposition (CVD) method. The substrate could be a CVD-grown graphene substrate on metallic films or foils made of, e.g., Cu, Ni, or Pt.

These CVD-grown graphitic layers can be chemically exfoliated from the metal foil such as a Ni or Cu film by etching or by an electrochemical delamination method. The graphitic layers after exfoliation are then transferred and deposited to the supporting carrier for micro/nanostructure growth. During the exfoliation and transfer, e-beam resist or photoresist may be used to support the thin graphene layers. These supporting materials can be easily removed by acetone after deposition.

In some cases graphene glass may be preferred as the graphitic layer. Graphene glass is made through direct formation of graphene over glass substrates using CVD. The use of graphene glass bypasses tedious and disruptive transfer procedures. By growing graphene directly on glass it is possible to avoid procedures where graphene is grown on metal foils and then transferred onto glass.

The surface of the graphitic layer may be modified. For example, it can be treated with plasma of hydrogen, oxygen, nitrogen, $NO_2$ or their combinations. Oxidation of the substrate might enhance micro/nanostructure nucleation. It may also be preferable to pretreat the substrate, for example, to ensure purity before micro/nanostructure growth. Treatment with a strong acid such as HF or BOE is an option. Substrates might be washed with iso-propanol, acetone, or n-methyl-2-pyrrolidone to eliminate surface impurities.

The cleaned graphitic surface can be further modified by doping. Dopant atoms or molecules may act as a seed for growing micro/nanostructures. A solution of $FeCl_3$, $AuCl_3$ or $GaCl_3$ could be used in a doping step.

Support for Graphitic Layer

A graphitic layer may need to be supported in order to allow bottom-up growth of the semiconductor e.g. nanostructures thereon. In some embodiments, a distributed Bragg reflector or metal mirror may be adjacent and parallel to the graphitic substrate on a surface opposite to the growing nanostructure. As the graphitic layer is highly transparent, the DBR or metal mirror can still perform its function without much loss in reflection. The DBR or metal mirror at the base of the device adjacent the graphitic layer may be designed to completely reflect light, e.g. an essentially 100% light reflector.

In one set of embodiments, a DBR or metal mirror is used at the top of the device, parallel to the graphene layer but separated therefrom by the micro/nanostructures. This allows for partial transmission (e.g. lower reflectivity DBR) of the light emitted/absorbed by the micro/nanostructure. It will be appreciated that the optional DBRs or metal mirrors at the top and bottom of the device can be switched so that the light is emitted in either direction (but parallel to the micro/nanostructures).

If, therefore, the DBR or metal mirror can tolerate the conditions of micro/nanostructure growth, then it may act as a support for the graphitic substrate during growth. Alternatively, the micro/nanostructures are grown on supported graphene first and then the graphene/structures are delaminated from the support and put on the DBR/metal mirror afterwards. In theory, once the micro/nanostructures are grown, the support might be removed (e.g. by etching) or the graphitic substrate carrying the micro/nanostructures can be peeled away from the support. It is therefore within the scope of the invention for the micro/nanostructures to be grown on a supported graphitic layer, for the support to be removed by peeling the graphitic layer with the micro/nanostructures away and placed on a distributed Bragg reflector or metal mirror in order to prepare the device of the invention.

Semiconductor Structure Fabrication

In some embodiments, the microstructure or nanostructure is a microwire or nanowire. It is ideal if growth of microwire(s) or nanowire(s) occurs perpendicular to the substrate and ideally therefore in the (for hexagonal crystal structure) direction or in the [111] direction (if cubic crystal structure). The inventors have realised that due to the hexagonal symmetry of the graphitic layer and the hexagonal symmetry of the semiconductor atoms in the (111) planes of a microwire or nanowire growing in the [111] direction with a cubic crystal structure (or in the (0001) planes of a microwire or nanowire growing in the [0001] direction with a hexagonal crystal structure), a lattice match can be achieved between the bottom-up growing microwires or nanowires and the substrate. A comprehensive explanation of the science here can be found in WO2013/104723.

In additional/alternative embodiments, the microstructures or nanostructures are micropyramids (MPs) or nanopyramids (NPs). These are formed using catalyst free growth or the Selective Area Growth (SAG) method. Similar to the micro/nanowires described above, the micro/nanopyramids also have hexagonal bases, and are lattice matched to the growth surface. The above description of growth planes also applies to MPs and NPs, as they are also grow along the [0001] direction. The size of a micro/nanopyramid can be controlled by the size of the opening that they are grown from, and/or by altering the growth time. As the walls of a micro/nanopyramid are inclined with respect to the substrate plane, and make an angle of, for example, between 40-60° with this plane, the aspect ratio of the micro/nanopyramid is close to 1. These inclined walls are semi-polar planes.

The different hexagonal arrangements of the semiconductor atoms as described in WO2013/104723, can enable semiconductor NWs of such materials to be vertically grown bottom-up to form free-standing NWs on top of a thin carbon-based graphitic material.

Whilst it is ideal that there is no lattice mismatch between a growing nanostructure and the substrate, nanostructures can accommodate much more lattice mismatch than thin films for example. This allows better quality hBN regions to be incorporated into the nanostructure. The nanostructures of the invention may have a lattice mismatch of up to about 10% with the substrate and epitaxial growth is still possible. Ideally, lattice mismatches should be 7.5% or less, e.g. 5% or less.

For some semiconductors like hexagonal GaN (a=3.189 Å) and hexagonal AlN (a=3.111 Å), the lattice mismatch is so small (<~2%) that excellent growth of these semiconductor nanostructures can be expected.

The length of a nanowire is important. Ideally, in some embodiments, these are grown so that they have a length equal to a half-integer multiple of the wavelength inside the NW of the light to be emitted by the laser/LED device. The NWs may also be grown so that the optical cavity of each NW has a length equal to a multiple of the wavelength of the light to be emitted by the NW.

Moreover, it will be preferred if the micro/nanostructures grown have the same dimensions, e.g. to within 10% of each other. Thus, at least 90% (preferably substantially all) of the micro/nanostructures on the graphitic layer will preferably be of the same dimensions (e.g. to within 10% of the diameter/length of each other). Essentially, therefore the skilled person is looking for homogeneity and micro/nanostructures that are substantially the same in terms of dimensions. The length/height of the micro/nanostructures is often controlled by the length of time for which the growing process runs.

In examples where the structures are nanowires (NWs), the NWs may typically have a hexagonal cross sectional shape. The NW may have a cross sectional diameter of 25 nm to several hundred nm (i.e. its thickness), e.g. 300 nm. As noted above, the diameter is ideally constant throughout the majority of the NW. NW diameter can also be controlled by the manipulation of the ratio of the atoms used to make the NW.

Moreover, the dimensions of the micro/nanostructures can be affected by the temperature at which they are formed. Higher temperatures encourage high aspect ratios (e.g. longer and/or thinner NWs). The diameter can also be controlled by manipulating the micro/nanohole opening size of the mask layer. The skilled person is able to manipulate the growing process to design micro/nanostructures of desired dimensions.

Materials

The semiconductor structure(s) are formed from at least one III-V compound semiconductor region. Group III element options are B, Al, Ga, In, and Tl. Preferred options here are B, Ga, Al and In. Group V options are N, P, As, Sb and Bi. All are preferred, especially N.

It is of course possible to use more than one element from group III and/or more than one element from group V. Preferred compounds for nanostructure manufacture include AlAs, GaSb, GaP, GaN, GaSbN, AlN, AlGaN, InGaN, AlGaInN, GaAs, GaAsSb, InP, InN, InSbN, InGaAs, InSb, InAs, or AlGaAs. Compounds based on Al, Ga and In in combination with N are most preferred. The use of GaN, AlGaN, InGaN, AlInGaN, AlInN or AlN is highly preferred.

Whilst the use of binary materials is possible, the use of ternary nanostructures in which there are two group III cations with a group V anion are preferred here, such as AlGaN. The ternary compounds may therefore be of formula XYZ wherein X is a group III element, Y is a group III or group V element different from X, and Z is a group V element different from Y.

Quaternary systems might also be used and may be represented by the formula ABCD where A is a group III element, B is a group III element different from A, C is a group III element or group V element different from A and B, and D is a group V element different from C.

The growth of GaN, AlN, InGaN, AlGaN, AlInN and AlInGaN nanostructures is especially preferred. The wavelength of light emitted/absorbed by a device containing these nanostructures can be tailored by manipulating the content of Al, In and Ga.

Positioned Growth of Semiconductor Structures

In order to prepare a more regular array of micro/nanostructures with better homogeneity in dimensions, a patterned mask may be used on the substrate. This mask can be provided with regular holes, where micro/nanostructures can grow bottom-up homogeneously in size in a regular array across the substrate. The size and the pitch of the holes can be carefully controlled. By arranging the holes regularly, a regular pattern of micro/nanostructures can be grown.

The term mask refers to the mask material that is directly deposited on the epitaxial face of the substrate (e.g. the graphitic layer). The mask material should ideally not absorb emitted light (which could be infrared, visible, UV-A, UV-B or UV-C). The mask should also be electrically non-conductive. The mask could contain one or more than one material, which include $Al_2O_3$, $SiO_2$, $Si_3N_4$, $TiO_2$, $W_2O_3$, $HfO_2$, and so on e.g. deposited by e-beam evaporation, CVD, plasma enhanced CVD (PECVD), sputtering, or atomic layer deposition (ALD). Subsequently, the hole patterns in the mask material can be prepared using electron beam lithography, deep UV lithography or nanoimprint lithography, together with dry or wet etching.

The use of a Ti mask that is either nitridated/oxidized before nanostructure growth is particularly preferred, as such a mask has been found to allow growth of uniform nanostructures (e.g. see J. Crystal Growth 311 (2009) 2063-68).

By varying the size of the holes, one can control the size of the nanostructures. It is important that the holes are suitably spaced. If the holes and hence the growing nanostructures are spaced by less than the wavelength of the light emitted by the laser, then the nanostructure array may act as a photonic crystal (PC). An array of 75 to 150 by 75 to 150 nanostructures, e.g. 100×100 nanostructures is a possible size. It should be noted that these numbers could vary massively depending on the design of the device.

The mask material can be any material which does not damage the underlying substrate when deposited. The minimum hole size might be 50 nm, preferably at least 100-200 nm. The thickness of the mask can be 10 to 100 nm, such as 10 to 40 nm.

The nanostructures can also be grown bottom-up without a mask with nano-hole patterns. In such case, the nanostructures may have non-uniform sizes (length and diameter), and may be located at random positions. In such cases that do not use a mask, the present inventors have found that the nanostructure density can be maximised. For example, nanostructures densities of at least 20 nanostructures per square micrometer are possible, such as at least 25 nanostructures per square micrometer. These very high nanostructures densities are particularly associated with GaN, InGaN or AlGaN nanostructures.

Distributed Bragg Reflector or Metal Mirror

As mentioned, in some embodiments, the device may comprise at least one distributed Bragg reflector (DBRs) or metal mirror. It will be appreciated that the DBRs and/or mirrors are not essential. For example, DBRs and/or mirrors may not be required for LEDs and non-light emitters. The below description describes some preferred examples. This description is made in respect of NWs devices, but it will be appreciated that the description applies equally to NP devices or other micro/nanostructure devices.

In light emitting applications, the DBRs or metal mirrors may define the resonant cavity of the NWs. This is defined by a highly reflective DBR mirror or metal mirror at one end, and preferably a lower reflectivity DBR or metal mirror on the other end of the NWs. Ideally, the higher reflectivity DBR or metal mirror is positioned adjacent the graphitic layer. Within the cavity, the NWs may comprise a gain medium, where current is injected to produce light—e.g. laser light having a single spatial lasing mode. The DBR is designed to reflect only in a single longitudinal mode. As a result, the laser operates on a single spatial and longitudinal mode. The laser preferably emits from the exit facet opposite the highly reflective DBR or metal mirror.

The DBR preferably comprises alternating layers of semiconductors that have different refractive indices. Each layer preferably has a thickness of a quarter of the laser wavelength in the material, yielding a reflectivity near 99%. Typically each DBR might contain 8 to 40 layers, such as 10 to 35 layers. Each layer may be 5 to 200 nm in thickness, such as 10 to 100 nm in thickness. Layers ideally reflect the refractive index of the layer in question. Thus, each layer might be 250 nm/refractive index of the layer. As typical refractive indices are around 3-4, the layer thickness may be 60 nm or so. The DBR must reflect and not absorb light and hence its band gap should be higher than that equivalent to the wavelength of light generated in the NW.

As an alternative to a distributed Bragg reflector at the bottom and/or top of the device, a metallic reflective layer might be used, e.g. based on Al. High reflectivity mirrors are required in VCSELs to balance the short axial length of the gain medium. Such a metallic layer may additionally/alternatively comprise aluminium, gold, silver, chromium, or rhodium. Preferably, the reflector is arranged to feedback light emerging from the NW back into the NW.

Filler

It is within the scope of the invention to use a filler to surround the assembly of layers where the filler may be transparent to the emitting light. Filler may be present in the space between micro/nanostructure(s) and/or around the assembly of layers as a whole. Different fillers might be used in the spaces between the micro/nanostructures than in the assembly as a whole. The filler may comprise a semiconductor material having a higher bandgap than the materials of the micro/nanostructure. Alternatively the filler may comprise a polymer and/or a resin.

FIG. 1 shows the band structure 100 of a known AlGaN based thin film device. The device comprises an n-type doped AlGaN region 102, with material ratios of $Al_{0.8}Ga_{0.2}N$. The device further comprises an intrinsic region 104, containing four quantum wells 106. The device further comprises an electron blocking layer 108, comprising a p-type doped AlN region. The device further comprises a p-type doped AlGaN region 110, with material ratios of $Al_{0.8}Ga_{0.2}N$. Finally, the device comprises a p-type doped GaN region 112.

Under forwards bias, electrons are injected into the conduction band of the intrinsic region 104 from the n-type doped AlGaN region 102. This is aided by the slight potential difference between the n-type doped AlGaN region 102 and the intrinsic region 104, resulting in a low resistivity, and therefore high carrier injection efficiency between these layers. Carrier confinement in the intrinsic region is further aided by the presence of the electron blocking layer 108. The electron blocking layer 108 provides a potential barrier in the conduction band, which aids in confining the electrons in the intrinsic region 104. This means that the quantum wells 106 have increased population, and thus the internal quantum efficiency of the device is increased. The composition of the quantum wells can also be precisely controlled in order to fine tune the wavelength of the radiative recombination in the device. Likewise, p-type doped AlGaN region 110 injects holes into the valence band of the intrinsic region 104 under forward bias. These holes populate the quantum wells 106 in the valence band of the intrinsic region 104. However, the potential barrier created by the electron blocking layer 108 in the valence band, means that the resistivity of this region is increased, and thus the hole injection efficiency is reduced. Electrons and holes undergo radiative recombination in the intrinsic region 104, supported by the presence of the quantum wells 106. In this example, the bandgap in the quantum wells 106 is 4.96 eV, corresponding to an emitted wavelength of 250 nm.

The p-type doped GaN region 112 is present to provide an improved ohmic connection with a top metal contact (not shown). As illustrated, the bandgap in this region is significantly smaller than the other layers of the device, and most importantly the p-type doped AlGaN region 110 (a difference of 0.6 eV). This large potential barrier increases the resistivity of this interface, further reducing the hole injection efficiency in the valence band.

FIG. 2 shows the band structure 200 of a semiconductor micro/nanostructure device, comprising a hBN region in a device according to an embodiment of the present invention. The semiconductor micro/nanostructure comprises an n-type doped AlGaN region 202, with material structure $Al_{0.8}Ga_{0.2}N$. The device further comprises an optional intrinsic region 204, containing four quantum wells 206. The device further comprises an hBN region 208, which in this embodiment acts as the electron blocking layer, the p-type doped region, the top contact layer, as well as a passivation or encapsulating layer.

As in FIG. 1, the n-type doped AlGaN region 202 in this embodiment injects electrons into the conduction band of the intrinsic region 204 under forward bias. This is aided by the slight potential difference between the n-type doped AlGaN region 202 and the intrinsic region 204, resulting in a low resistivity, and therefore high carrier injection efficiency between these layers. Carrier confinement in the intrinsic region is further aided by the presence of the hBN region 208. As mentioned, the hBN region 208 acts as the electron blocking layer in this embodiment. The increased potential barrier in the conduction band compared to the AlN electron blocking layer 108 provides increased carrier confinement in the intrinsic region 204. Once again, this increases the population of the quantum wells 206, leading to increased internal quantum efficiency in the device 200.

As previously mentioned, the hBN region 208 also acts as the p-type region for the device 200. This means that the hBN region 208 injects holes into the intrinsic region 204 under forward bias. As shown, there is a reduced potential barrier between the hBN region 208 and the intrinsic region 204 in the valence band. This results in a reduced resistivity at this interface, increasing the hole injection efficiency. The holes injected from the hBN region 208 populate the quantum wells 206. With the quantum wells 206 in both the conduction and valence band populated, the electrons and holes undergo radiative recombination to produce light. As before, the bandgap of the quantum wells 206 is 4.96 eV, corresponding to an emitted wavelength of 250 nm.

In this embodiment, the hBN region 208 further acts as a replacement for the usual top p-AlGaN and p-contact for the device 200. This is made possible due to the intrinsic p-type nature of hBN, and can be further exploited in some embodiments due to its high p-type doping efficiency. This means that the layer can have a high carrier concentration, and thus in combination with its band properties, it can provide a sufficient ohmic contact for the device.

A semiconductor micro/nanostructure having a band structure as seem in FIG. 2 is grown on a graphitic layer to form a device as described further below. For example, such devices may combine a semiconductor micro/nanostructure with a distributed Bragg reflector (DBR). The semiconductor structure may be a nanostructure comprising one or more nanowires (NWs) or nanopyramids (NPs).

FIGS. 3a-3f summarize the fabrication process of an integrated NW/graphene/DBR laser or RCLED device. Due to the coherent coupling among DBR, NWs, and high reflectivity NW top-mirror, a NW-based vertical-cavity surface-emitting laser (VCSEL) will be demonstrated with the ultimate goal of achieving low threshold current and high light emission efficiency. Surface-emitting photonic crystal (PC) properties can also be developed by tuning the NW diameter and the pitch size between the NWs. The DBR can be made of multilayers of thin films grown by MBE or MOCVD (e.g. AlN/(Al)GaN), where crystal orientation is in general (0001). Another type of DBR can be fabricated with insulating layers. However, such thin films with crystal orientation of (0001) or insulating layers cannot be used for vertical NW growth. This issue can be solved by using graphene as a buffer layer. In addition, the graphene can be used as a carrier injection layer due to its high conductivity and transparency in the DUV region.

Figure 3C:
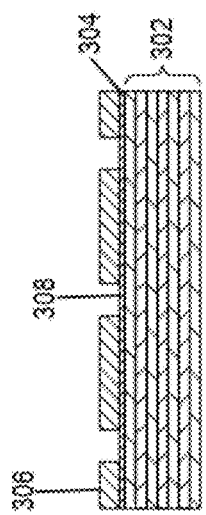
FIGS. 3a-3f illustrate a process flow for fabricating a device with bottom-up grown nanowires in accordance with an embodiment of the present invention.
Figure 3F:
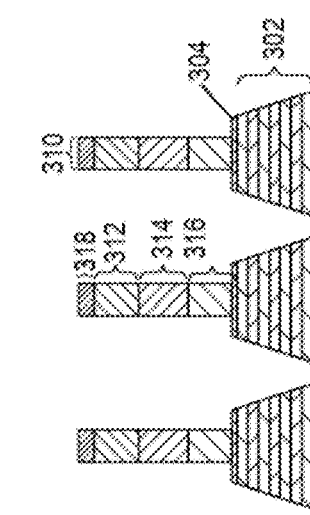
Figure 3B:
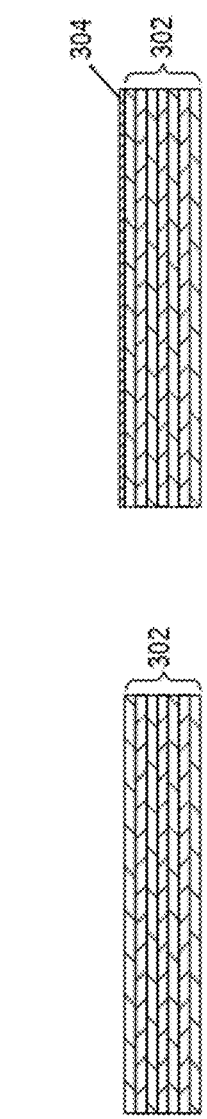
Figure 3E:
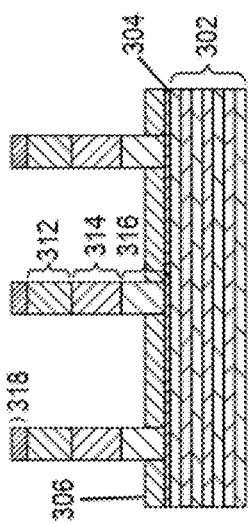
Figure 3D:
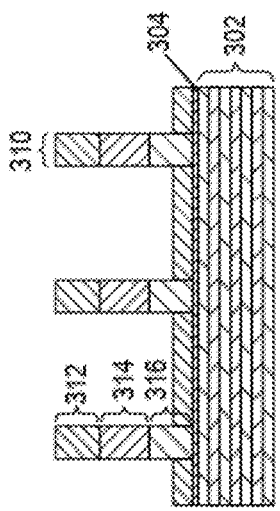
Figure 3A:
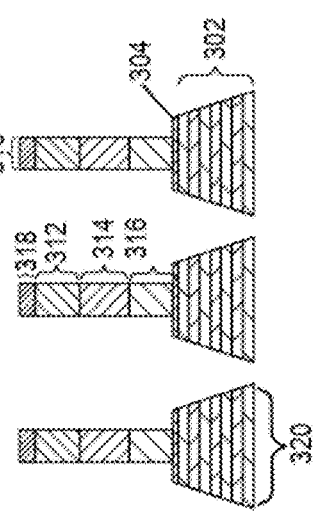

In FIG. 3a a substrate layer in the form of a DBR 302 is provided. A high-quality DBR, for example with AlN/(Al)GaN Bragg pairs, may be grown by MBE or MOCVD. FIG. 3b shows the deposition of a graphene layer (e.g. single-layer or double-layer) 304 on the DBR 302. A subsequent mask layer 306 is then applied, and etched (using typical methods in the art) to form holes 308 for positioned nanowire growth, as seen in FIG. 3c.

As shown in FIG. 3d, nanowires 310 are then grown bottom-up in the holes 308 such that an n-type doped region 316 (e.g. an n-type $Al_{0.75}Ga_{0.25}N$ region) is grown first followed by an intrinsic-region 314 which preferably comprises at least one heterostructure (e.g. a quantum well such as an $Al_{0.6}Ga_{0.4}N$ quantum well). Then a p-type doped region 312 comprising a p-type hBN region (optionally doped) is grown on the intrinsic region 314. The n-type and p-type doped regions form a lower and an upper cladding, respectively. A top reflective layer 318 (e.g. an Al metal mirror) is then formed on the p-type doped region 312 of each NW 310 (FIG. 3e). Optionally the mask layer 306 may be removed (e.g. using a suitable wet-etch). Further optionally, as shown in FIG. 3f, the graphene layer 304 and Bragg reflector 302 between the NWs 310 may then be etched to create individual NW lasers 320. Of course, other types of bottom-up growth techniques may be used to grow the nanowires. Each of the NWs 310 may be electrically or optically pumped. The Al metal mirror 318 and the graphene layer 304 may be used as electrodes for applying a forward bias/current across the NWs 310.

Figure 3G:
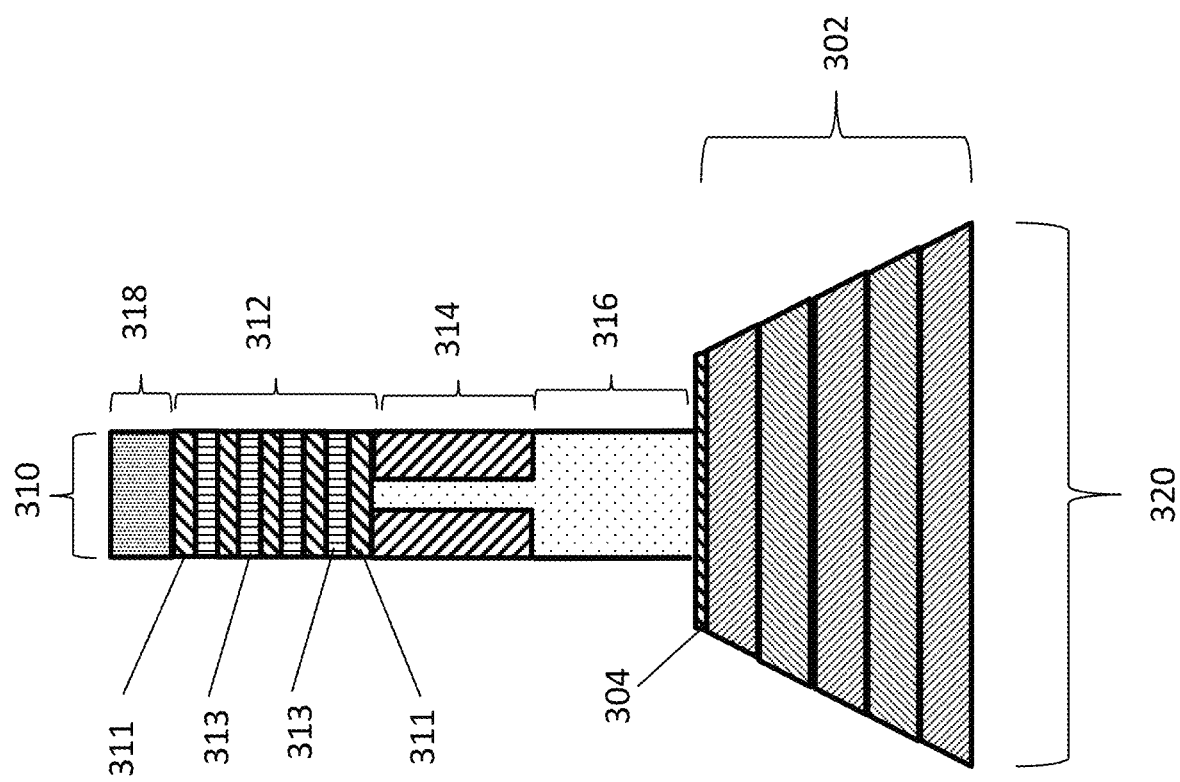
FIGS. 3g and 3h illustrate a nanowire structure, each in accordance with an embodiment of the present invention.

FIG. 3g shows the nanowire 310 shown in FIG. 3f, where the p-type doped hBN region 312 comprises a plurality of hBN layers, at least one of which is undoped 311 and at least one of which is p-type doped 313. The undoped hBN layer 311 forms an interface with the III-V semiconductor n-type doped region 316, and the intrinsic III-V region 314 is between the n-type doped region 316 and hBN region 312.

Figure 3H:
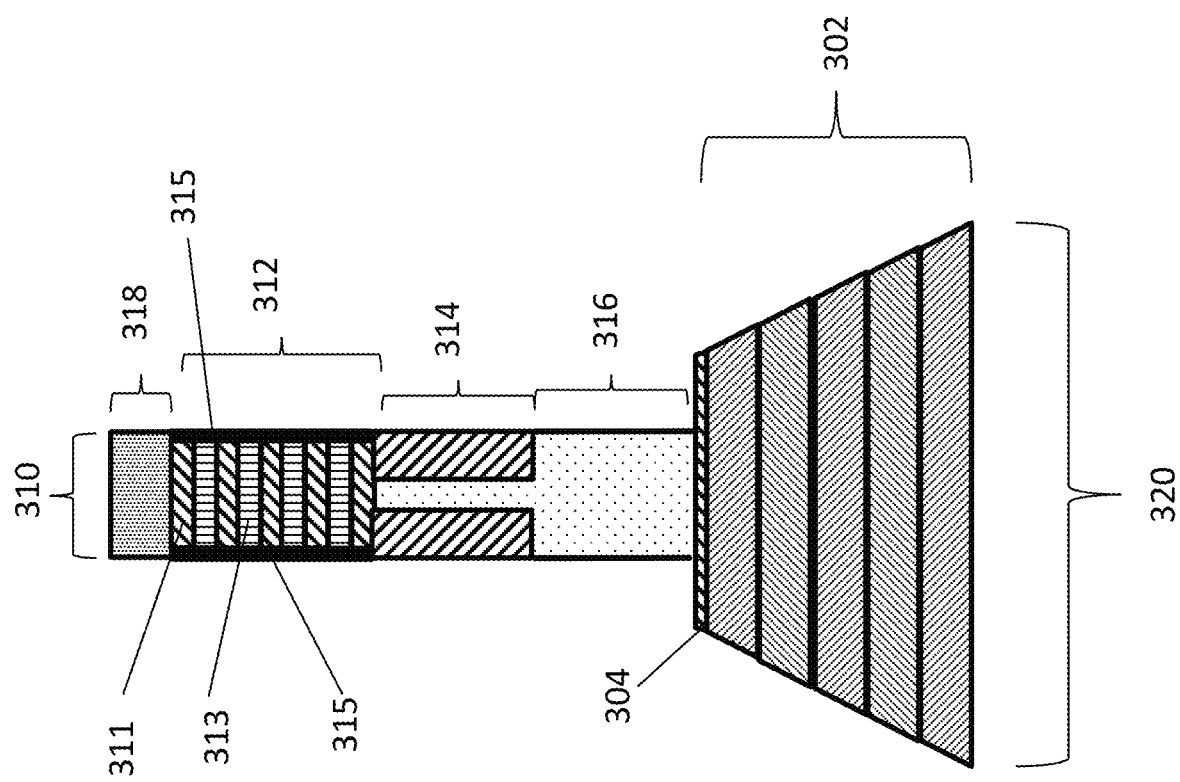

FIG. 3h shows the nanowire 310 shown in FIG. 3g, where the hBN region 312 comprises a passivation layer 315.

Figure 4B:
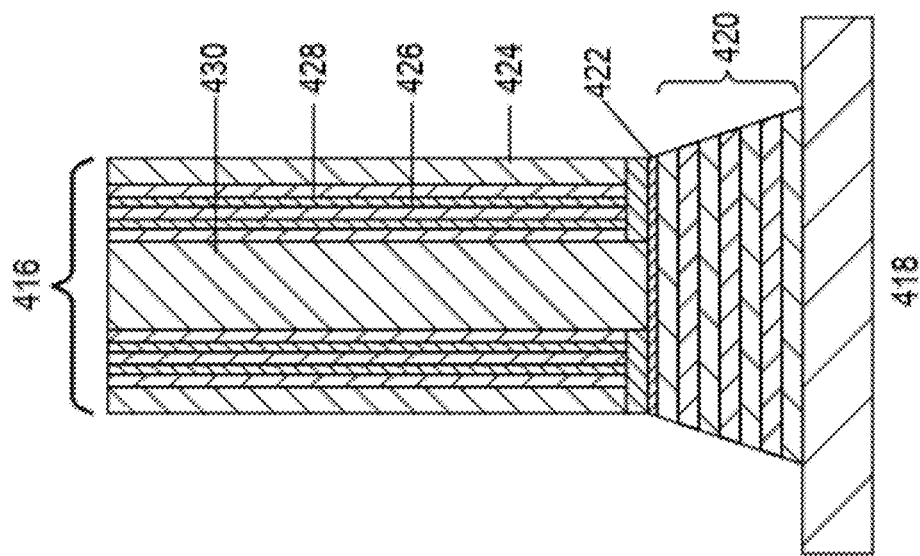
FIGS. 4a and 4b illustrate the structure of an axial nanowire laser, and a radial nanowire laser, each in accordance with an embodiment of the present invention.
Figure 4A:
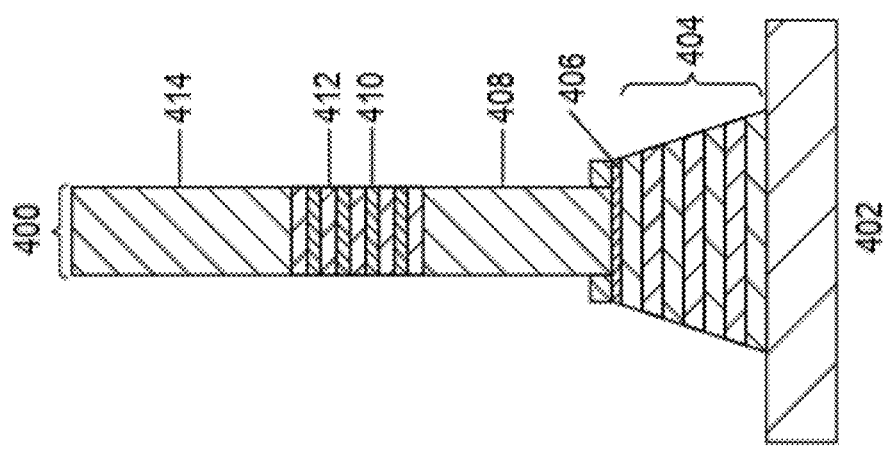
Figure 5A:
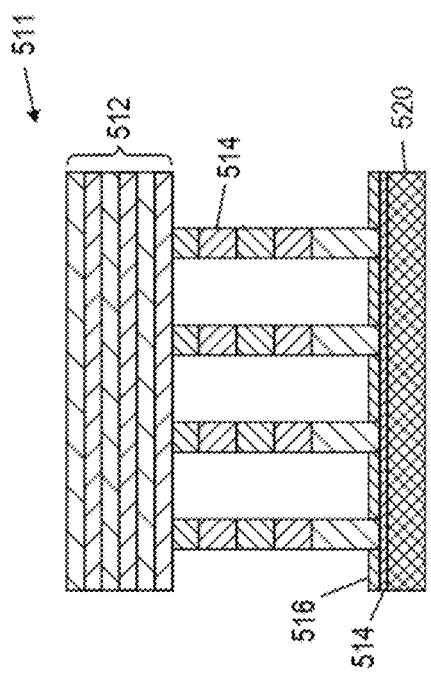
FIGS. 5a-5d illustrate various types of NW VCSEL structures in accordance with embodiments of the present invention.
Figure 5B:
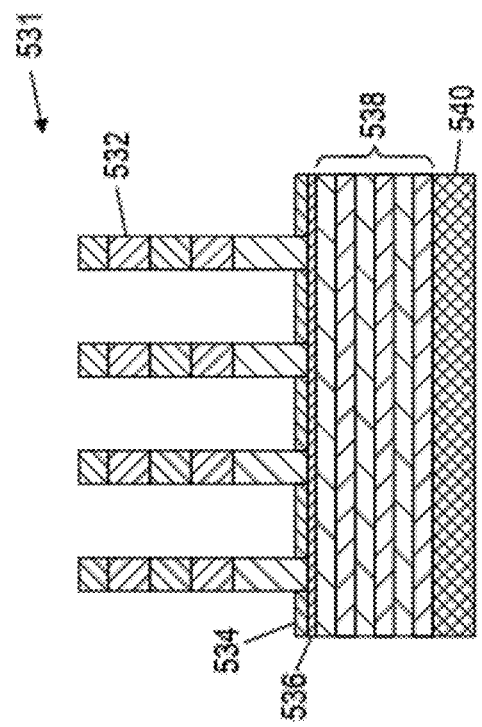
Figure 5C:
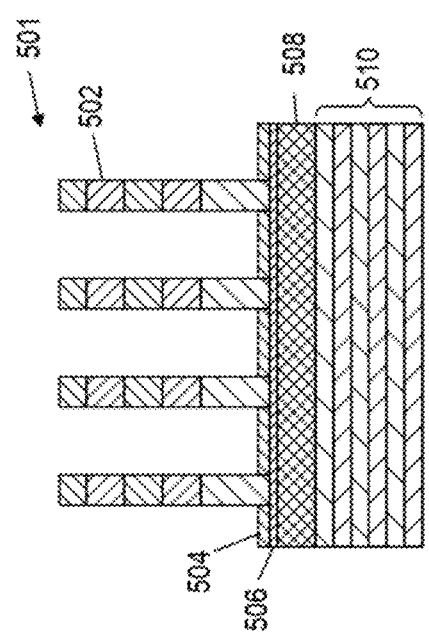
Figure 5D:
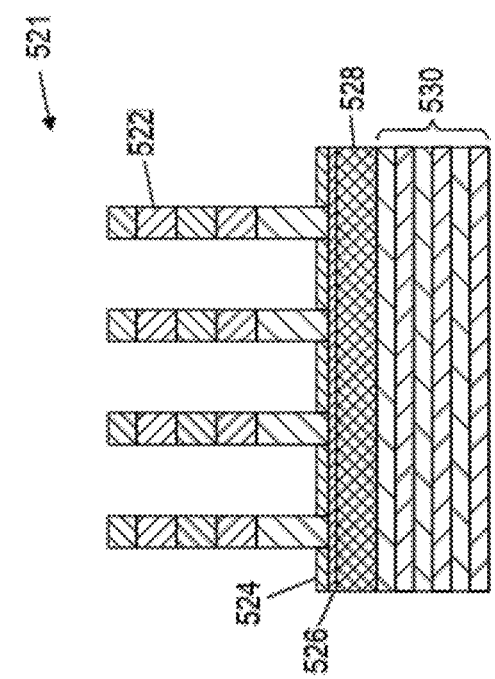

FIG. 4 shows two nanowires grown with axial heterostructures 400, and radial heterostructures 416, respectively. The nanowire with axial heterostructures 400 is grown on a graphitic layer 406, disposed on a DBR 404. The DBR 404 is attached to an underlying support layer 402. DBR 404 and support structure 402 are part of the layer that makes up the substrate. The nanowire with axial heterostructures 400 comprises a n-type AlGaN layer 408, an intrinsic AlGaN barrier layer 412, i-AlGaN quantum wells 410, and a p-type hBN layer 414.

The nanowire with radial heterostructures 416 is grown on a graphitic layer 422, disposed on a DBR 420. The DBR 420 is attached to an underlying support layer 418. DBR 420 and support structure 418 are part of the layer that makes up the substrate. The nanowire with radial heterostructure 416 comprises a n-type AlGaN layer 430, an intrinsic AlGaN barrier layer 426, i-AlGaN quantum wells 428, and a p-type hBN layer 424.

FIGS. 5a-d show different forms of nanowire laser/LED devices. In device 501 (FIG. 5a), a bottom DBR 510 or metal mirror is provided with a transparent intermediate layer 508 (e.g. a silica layer) on top of which is located a graphene layer 506. An optional mask layer 504 (e.g. an oxide mask) is deposited on the graphitic and underlying substrate layers, in which holes are made for bottom-up growth of nanowires 502. This arrangement allows for tuning of reflectivity and/or protection (capping) of e.g. a GaAs/Al(Ga)As DBR during bottom-up epitaxial growth (at high temperature) of nanowires 502 on the graphene layer 506.

In device 511 (FIG. 5b), a DBR 512 is formed on the top of a set of nanowires 514. The nanowires 514 are grown on a graphene layer 518 which is supported on transparent silica 520, e.g. fused silica support, or other transparent support. Again, an optional mask layer 516 (e.g. an oxide mask) is deposited on the graphitic and underlying substrate layers 520, in which holes are made for bottom-up growth of the nanowires 514. Optionally graphene glass may be used as a combined substrate and support.

Device 521 (FIG. 5c) shows an alternative option to device 501, where the graphene layer 526 and the transparent intermediate layer 528 (e.g. glass) forms graphene glass which can also provide a support for bottom-up nanowire 522 growth. A bottom DBR 530 or metal mirror can be provided after nanowire 522 growth. Again, an optional mask layer 524 (e.g. an oxide mask) is deposited on the substrate layers 526, 528, 530, in which holes are made for bottom-up growth of the nanowires 522.

Device 531 (FIG. 5d) shows another alternative option wherein a DBR 538 is supported on glass 540. Here, a graphene layer 536 is provided on the DBR 538 for the growth of nanowires 532. Again, an optional mask layer 534 (e.g. an oxide mask) is deposited on the graphene layer 536 and underlying substrate layers 538, 540, in which holes are made for bottom-up growth of the nanowires 532.

FIG. 6a shows a device (e.g. a UV LED) having AlGaN-based nanowires 614 grown bottom-up on a graphene layer 604 located on a substrate 602. A mask layer 606 (e.g. an oxide mask) is deposited/grown on the graphene layer 604, in which holes are made (using e.g. e-beam lithography and etching) for positioned nanowire growth. Each of the nanowires 614 are axial nanowires with an AlGaN/AlGaN quantum heterostructured active region 610, an n-type doped AlGaN region 608, and a p-type doped hBN region 612. The n-type doped AlGaN region 608 is directly grown epitaxially on the graphene layer 604, which is followed by the growth of the active region 610 comprising five intrinsic AlGaN/AlGaN quantum wells. After that, the p-type doped hBN region 612 is grown. It will be appreciated that the p-type doped hBN region 612 forms a p-type doped injection region for injecting holes into the active gain medium 610. In addition, the p-type doped hBN region 612 forms an EBL, and a top contact layer for forming an ohmic contact with an electrode.

FIG. 6b shows a device (e.g. a UV LED) having AlGaN-based nanowires 628 grown bottom-up on a graphene layer 618 located on a substrate 616. A mask layer 620 (e.g. an oxide mask) is deposited/grown on the graphene layer 618, in which holes are made (using e.g. e-beam lithography and etching) for positioned nanowire growth. Each of the nanowires 628 are core-shell nanowires with an AlGaN/AlGaN quantum heterostructured active gain medium 624, an n-type doped AlGaN core region 622, and a p-type doped hBN shell region 626. The n-type doped AlGaN core region 622 is directly grown epitaxially on the graphene layer 618, which is followed by the growth of the active region 624 comprising five intrinsic AlN/AlGaN quantum wells. After that, the p-type doped hBN shell region 626 is grown. It will be appreciated that the p-type doped hBN shell region 626 forms a p-type doped injection region for injecting holes into the active gain medium 624. In addition, the p-type doped hBN shell region 626 forms an EBL, and a top contact layer for forming an ohmic contact with an electrode.

Figure 7:
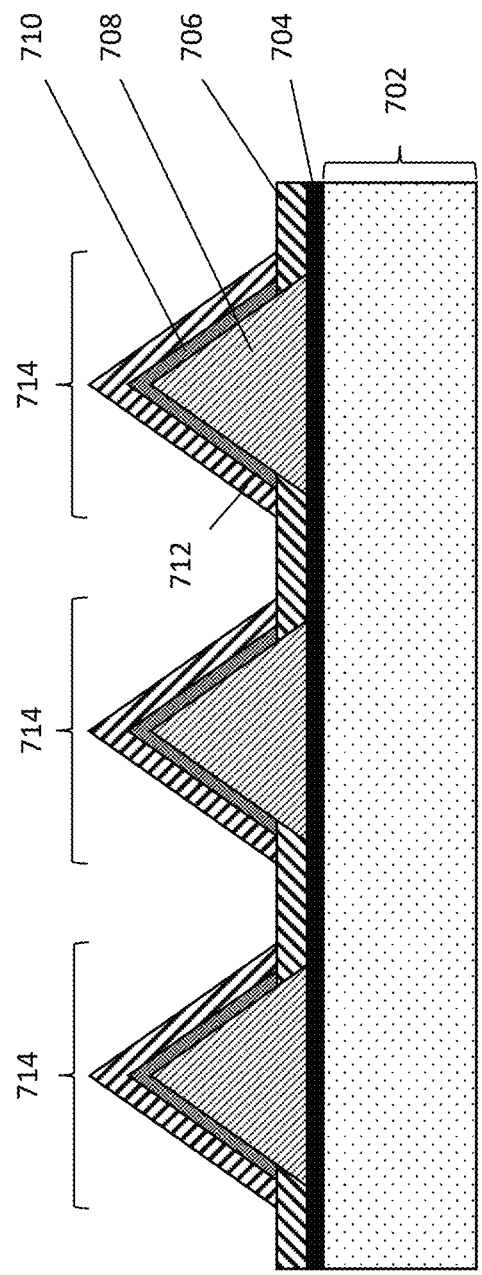
FIG. 7 illustrates the structure of a core-shell nanopyramid in accordance with an embodiment of the present invention.

FIG. 7 shows a device (e.g. a UV LED) having AlGaN-based nanopyramids 714 grown bottom-up on a graphene layer 704 located on a substrate 702. Each of the nanopyramids 714 are core-shell nanopyramids with an AlGaN/AlGaN quantum heterostructured active gain medium 710, an n-type doped AlGaN core region 708, and a p-type doped hBN shell region 712. The n-type doped AlGaN core region 708 is directly grown epitaxially on the graphene layer 704, which is followed by the growth of the active region 710 comprising five intrinsic AlGaN/AlGaN quantum wells. After that, the p-type doped hBN shell region 712 is grown. It will be appreciated that the p-type doped hBN shell region 712 forms a p-type doped injection region for injecting holes into the active gain medium 710. In addition, the p-type doped hBN shell region 712 forms an EBL, and a top contact layer for forming an ohmic contact with an electrode.

The invention claimed is:

1. A semiconductor device comprising:
a substrate layer,
a graphitic layer,
at least one semiconductor structure grown on the graphitic layer, the at least one semiconductor structure comprising at least:
a III-V semiconductor n-type doped region,
a hexagonal Boron-Nitride (hBN) region, wherein the hBN region comprises a plurality of hBN layers, at least one of which is undoped and at least one of which is p-type doped; and
wherein the undoped hBN layer forms an interface with the III-V semiconductor n-type doped region;
wherein the hBN region comprises a passivation layer.

2. The device as claimed in claim 1, wherein the III-V semiconductor n-type doped region is positioned closer to the graphitic layer than the hBN region is positioned to the graphitic layer.

3. The device as claimed in claim 1, wherein the graphitic layer is disposed on the substrate layer.

4. The device as in claim 1, wherein the substrate layer comprises a distributed Bragg reflector.

5. The device as claimed in claim 1, wherein the hBN region is p-type doped and the p-type doped hBN region forms a contact layer.

6. The device as claimed in claim 1, wherein the III-V semiconductor n-type doped region is grown on the graphitic layer, and the hBN region is deposited on the n-type doped region.

7. The device as claimed in claim 1, wherein the at least one semiconductor structure is grown bottom up from the graphitic layer.

8. The device as claimed in claim 1, wherein the at least one semiconductor structure further comprises an intrinsic III-V semiconductor region between the n-type doped region and the hBN region.

9. The device as claimed in claim 8, wherein the intrinsic III-V semiconductor region comprises at least one heterostructure.

10. The device as claimed in claim 1, wherein the at least one semiconductor structure further comprises a p-type doped III-V semiconductor region.

11. The device as claimed in claim 10, wherein the n-type doped region comprises electrons, the p-type doped region comprises holes, and the at least one semiconductor structure further comprises an intrinsic III-V semiconductor region arranged to receive electrons from the n-type doped region and holes from the p-type doped region so that the received electrons and holes undergo recombination to emit light, or the at least one semiconductor structure further comprises an intrinsic III-V semiconductor region arranged to generate electron-hole pairs upon absorbing a photon.

12. The device as claimed in claim 1, wherein the III-V semiconductor is a group III-nitride semiconductor.

13. The device as claimed in claim 1, wherein the at least one semiconductor structure is a nanostructure.

14. The device as claimed in claim 13, wherein the nanostructure comprises an axial heterostructure and/or a radial heterostructure.

15. The device as claimed in claim 13, wherein the nanostructure is grown through holes of a hole-patterned mask on the graphitic layer.

16. The device as claimed in claim 1, further comprising a metal layer on a surface of the at least one semiconductor structure.

17. The device as claimed in claim 16, wherein the metal layer acts as a top contact layer or as a mirror.

* * * * *